United States Patent [19]
Shaffer et al.

[11] Patent Number: 6,081,463
[45] Date of Patent: Jun. 27, 2000

[54] SEMICONDUCTOR MEMORY REMAPPING

[75] Inventors: James M. Shaffer; Brent Keeth; Eugene H. Cloud; Salman Akram, all of Boise, Id.

[73] Assignee: Micron Technology, Inc., Boise, Id.

[21] Appl. No.: 09/030,498

[22] Filed: Feb. 25, 1998

[51] Int. Cl.$^7$ ................................................. G11C 7/00
[52] U.S. Cl. ............................................................. 365/200
[58] Field of Search .............................. 365/200, 230.06; 371/26.1, 10.3; 395/182.05, 183.18

[56] References Cited

U.S. PATENT DOCUMENTS

| | | | |
|---|---|---|---|
| 3,681,757 | 8/1972 | Allen et al. | 340/172.5 |
| 4,475,194 | 10/1984 | Lavallee et al. | 371/10 |
| 4,476,546 | 10/1984 | Varshney | 365/200 |
| 5,110,754 | 5/1992 | Lowrey et al. | 437/57 |
| 5,270,975 | 12/1993 | McAdams | 365/200 |
| 5,276,834 | 1/1994 | Mauritz et al. | 395/425 |
| 5,281,868 | 1/1994 | Morgan | 307/441 |
| 5,324,681 | 6/1994 | Lowrey et al. | 437/52 |
| 5,406,565 | 4/1995 | MacDonald | 371/10.3 |
| 5,475,648 | 12/1995 | Fujiwara | 365/230.06 |
| 5,513,137 | 4/1996 | Lee et al. | 365/185.09 |
| 5,528,539 | 6/1996 | Ong et al. | 365/200 |
| 5,539,698 | 7/1996 | Suzuki | 365/200 |
| 5,572,470 | 11/1996 | McClure et al. | 365/200 |
| 5,574,688 | 11/1996 | McClure et al. | 365/200 |
| 5,720,031 | 2/1998 | Lindsay | 395/183.18 |
| 5,838,893 | 11/1998 | Douceur | 395/182.05 |
| 5,841,710 | 11/1998 | Larsen | 365/200 |

*Primary Examiner*—David Nelms
*Assistant Examiner*—Anh Phung
*Attorney, Agent, or Firm*—Schwegman, Lundberg, Woessner & Kluth, P.A.

[57] ABSTRACT

Defective memory is programmed to have a contiguous address space by dividing the logical address space of the memory into a plurality of address sections. The address section containing the address mapped to a defective memory location is identified. The physical memory locations originally mapped to the addresses in the identified address section are remapped to addresses in an address section at one end of the address space. The addresses in the end address section are disabled. Alternatively, spare memory is provided and the addresses in the end address section are remapped to physical locations in the spare memory. A similar remapping procedure is applied to repair defective data paths in a memory. The remapping procedure is applicable to memory devices or memory modules.

18 Claims, 4 Drawing Sheets

SEMICONDUCTOR MEMORY REMAPPING

FIELD OF THE INVENTION

The present invention relates to integrated circuits such as memory circuits and in particular the present invention provides for remapping and replacing a defective element in semiconductor memory with a like element in another semiconductor memory.

BACKGROUND OF THE INVENTION

As the number of electronic elements contained on semiconductor integrated circuits continues to increase, the problems of reducing and eliminating defects in the elements becomes more difficult. To achieve higher population capacities, circuit designers strive to reduce the size of the individual elements to maximize available die real estate. The reduced size, however, makes these elements increasingly susceptible to defects caused by material impurities during fabrication. These defects can be identified upon completion of the integrated circuit fabrication by testing procedures, either at the semiconductor chip level or after complete packaging. Scrapping or discarding defective circuits is economically undesirable, particularly if only a small number of elements are actually defective.

Therefore, typically redundant elements are provided on the circuit to reduce the amount of semiconductor scrap. If a primary element is determined to be defective, a redundant element can be substituted for the defective element. Substantial reductions in scrap can be achieved by using redundant elements.

One type of integrated circuit device which uses redundant elements is electronic memory. Typical memory circuits comprise millions of equivalent memory cells arranged in addressable rows and columns. By providing redundant elements, either as rows or columns, defective primary rows or columns can be replaced. Thus, using redundant elements reduces scrap without substantially increasing the cost of the memory circuit.

There are limitations inherent in this approach that affect yield and downstream costs. Although earlier generations of memory devices could compensate by supplying a few redundant rows and columns, new generations of memory devices require considerably more redundant memory to compensate for multiple failed sections.

Thus, semiconductor memory manufacturers are faced with the problem of maximizing repairabilty of semiconductor memory to maximize yield with minimum impact on production costs, and without adding considerable complexity to the semiconductor memory architecture. Moreover, the increase in yield has to be achieved without significantly increasing overall cost of the memory system, and the size of the memory package.

Many manufacturers have attempted to achieve these goals by combining partially defective chips, or "partials," into packages which have non-standard configurations. However, the partials must be carefully matched to ensure there are no "holes" in the addressing space of the finished device. Furthermore, the addressing schemes which are employed to map the partials into a contiguous addressing space are different from those used when replacing defective rows and columns with spare elements, thus increasing the complexity of the programming which the manufacturer must incorporate into its fabrication process.

For the reasons stated above, and for other reasons stated below which will become apparent to those skilled in the art upon reading and understanding the present specification, there is a need in the art for a simple, and yet effective way to enhance the usability of defective semiconductor memory to maximize yield, but with minimum impact on production costs and without adding considerable complexity to the semiconductor memory architecture.

SUMMARY OF THE INVENTION

Defective memory is programmed to have a contiguous address space by dividing the logical address space of the memory into a plurality of address sections. The address section containing the address mapped to a defective memory location is identified. The physical memory locations originally mapped to the addresses in the identified address section are remapped to addresses in an address section at an end of the address space. The addresses in the end address section are disabled. Alternatively, spare memory is provided and the addresses in the end address section are remapped to physical locations in the spare memory. A similar remapping procedure is applied to repair defective data paths in a memory. The remapping procedure is applicable to memory devices or memory modules.

The remapping procedure enables the use of partials in a memory module without the need to meticulously match the partials before assembling the module. Furthermore, the remapping procedure can be invoked during fabrication of the memory device or module, or after the component is installed in a computer, and is also disclosed. Thus, the remapping procedure reduces the amount of semiconductor scrap with minimal additional manufacturing cost and provides added value to the product purchaser.

DESCRIPTION OF THE PREFERRED EMBODIMENTS

In the following detailed description of the preferred embodiments, reference is made to the accompanying drawings which form a part hereof, and in which is shown by way of illustration specific preferred embodiments in which the invention may be practiced. The preferred embodiments are described in sufficient detail to enable those skilled in the art to practice the invention, and it is to be understood that other embodiments may be utilized and that logical, changes may be made without departing from the spirit and scope of the present invention. The following detailed description is, therefore, not to be taken in a limiting sense, and the scope of the present invention is defined only by the appended claims.

The present invention is described as applied to a single in-line memory module (SIMM) and to a dynamic random access memory (DRAM) device. It will be understood that the invention is not limited to SIMMs or DRAMs, but can be equally applied to other memory modules, such as dual in-line memory modules (DIMM) and embedded DRAM, and other memory devices, such as video random access memories (VRAM) and static RAM (SRAM).

Figure 1:
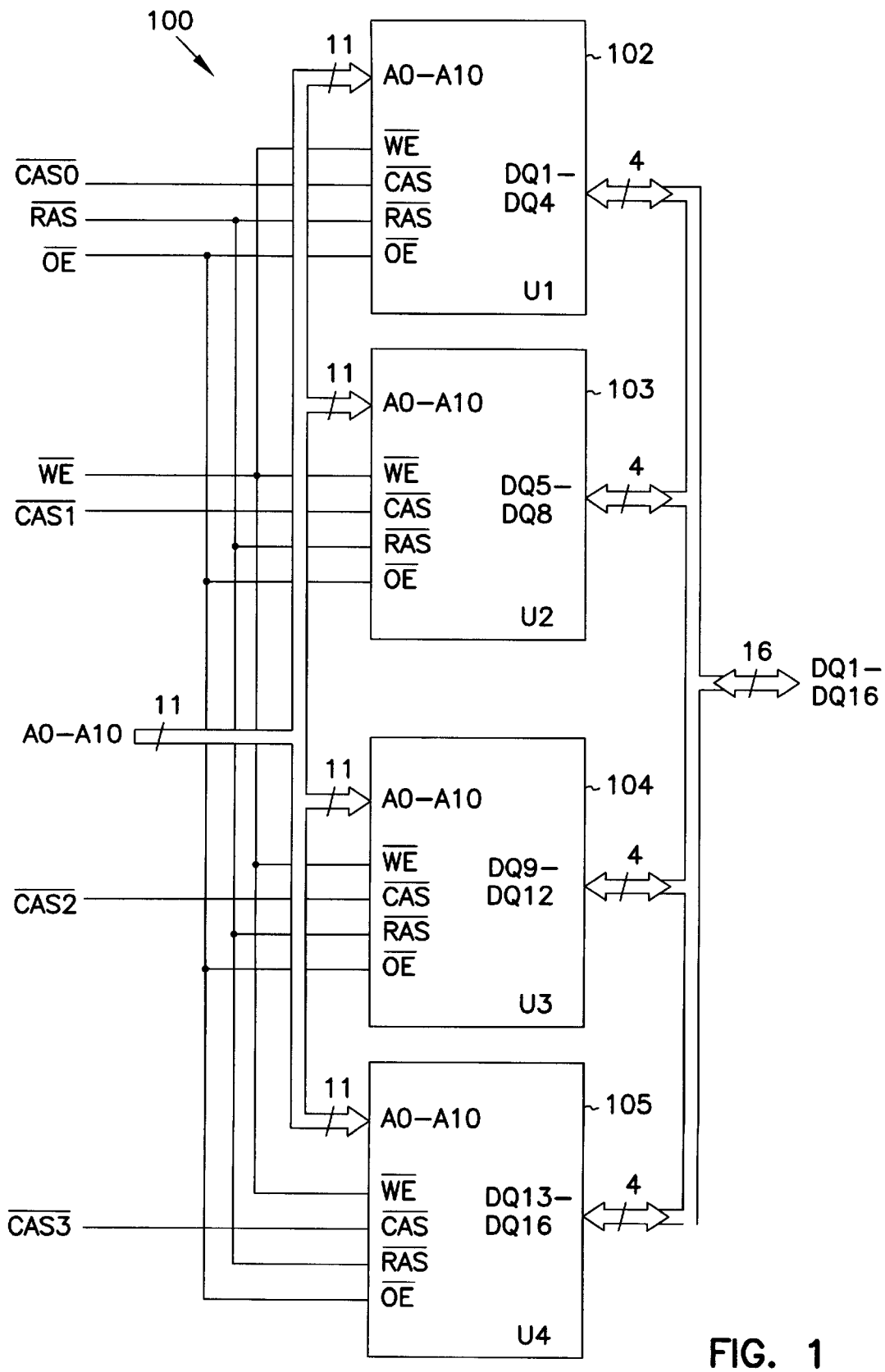
FIG. 1 is a block diagram of a memory module with four memory devices.
Figure 2:
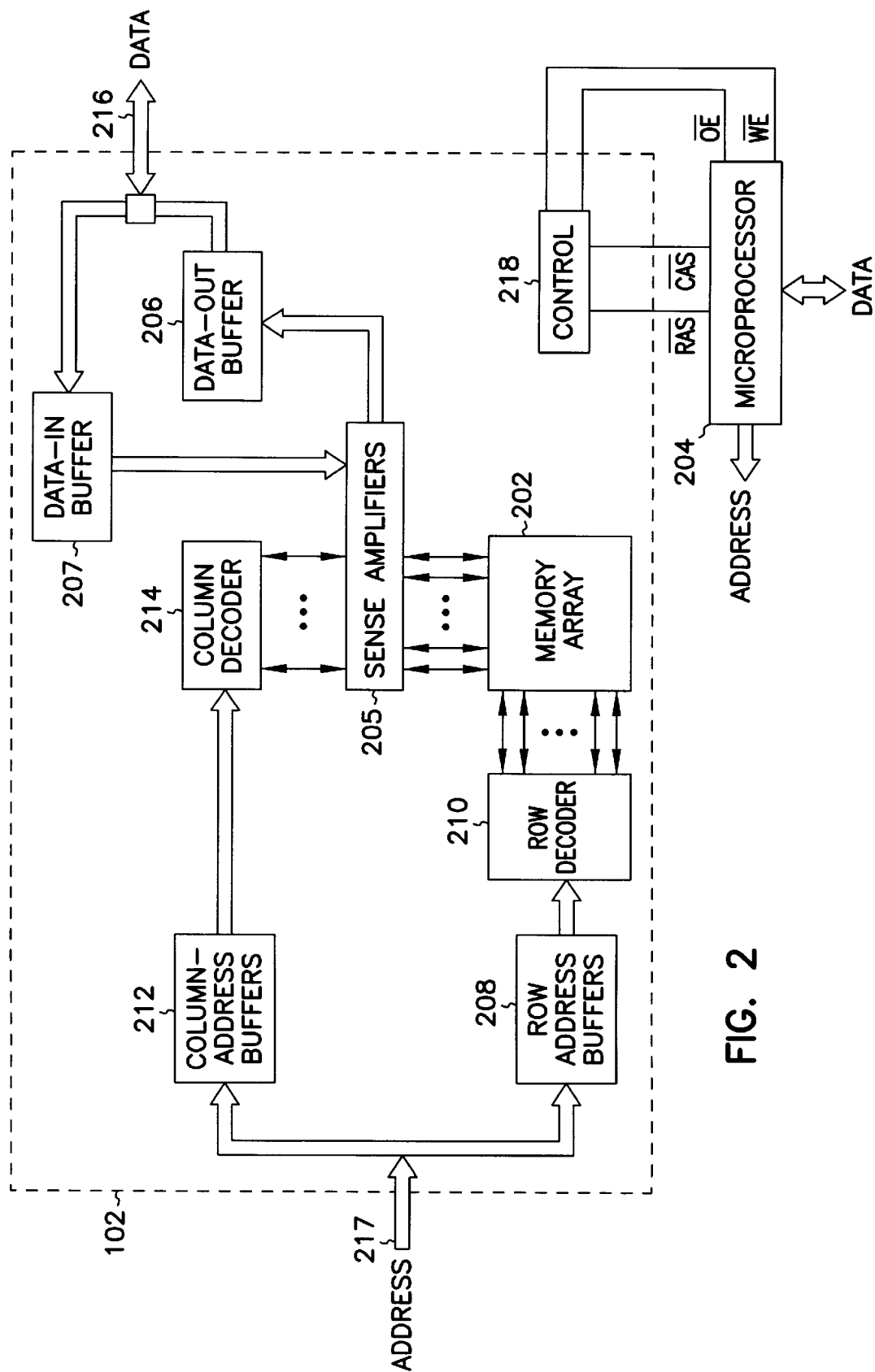
FIG. 2 is a block diagram of a memory array within a memory device such as that shown in FIG. 1.

The description of FIGS. 1 and 2 and is intended to provide a general understanding of a SIMM and a DRAM and is not a complete description of all the elements and features of either.

An example N megabyte×16 SIMM 100 comprising four DRAMs 102–105 is shown as a functional block diagram in FIG. 1. SIMM 100 has 16 data lines DQ1–DQ16 which combine to input or output a 16-bit word. DQ1–DQ4 are assigned to DRAM 102, DQ5–DQ8 to DRAM 103, DQ9–DQ12 to DRAM 104, and DQ13–DQ16 to DRAM 105. SIMM 100 is addressed through address lines A0–A11. The capacity of SIMM 100 depends on the size of the DRAMs, i.e., four 4 Mb DRAMs create a 4 Mb×16 SIMM.

DRAM 102 is a typical DRAM, such as those available from Micron Technology Inc. of Boise, Id., and is shown as a functional block diagram in FIG. 2. DRAM 102 has a memory array 202 and associated circuitry for reading from and writing to the memory array. The memory array 202 is arranged in an x-y grid, or rows and columns of memory cells. The DRAM can be accessed by a microprocessor, memory controller, a chip set, or other external system (represented generically as microprocessor 204) through input/output connections including embedded DRAM periphery address lines 217 (A0–A11 in FIG. 1). Row decoder 210 decodes a row address from an address signal provided on address lines 217, and addresses the corresponding row of the memory array 202. Likewise, column decoder 214 decodes a column address from an address signal provided on address lines 217, and addresses the corresponding column of the memory array 202. Data stored in the memory array 202 can be transferred to outputs 216 (DQ1–DQ4 in FIG. 1) through a data output buffer 206. Similarly, data input buffer 207 is used to receive data from DQ1–DQ4 and transfer the data to the memory array 202.

Sense amplifier circuitry 205 is provided to sense and amplify data stored on the individual memory cells of the DRAM array.

Control circuitry 218 is provided to monitor the memory circuit inputs and control reading and writing operations. Output enable (OE*) enables the output buffer 206 of the DRAM. Write enable (WE*) is used to select either a read or write operation when accessing the DRAM. Row address strobe (RAS*) input is used to clock in the row address bits. Column address strobe (CAS*) input is used to clock in the column address bits.

Failures in memory devices are frequently due to failures in either a portion of a memory array or in a data path connecting a portion of an array to a DQ. In either case, the present invention provides a unique remapping procedure that minimized the impact of such failures on the manufacturer of the device. Further, the procedure can be extrapolated to encompass remapping of memory modules as well as memory arrays.

Figure 3:
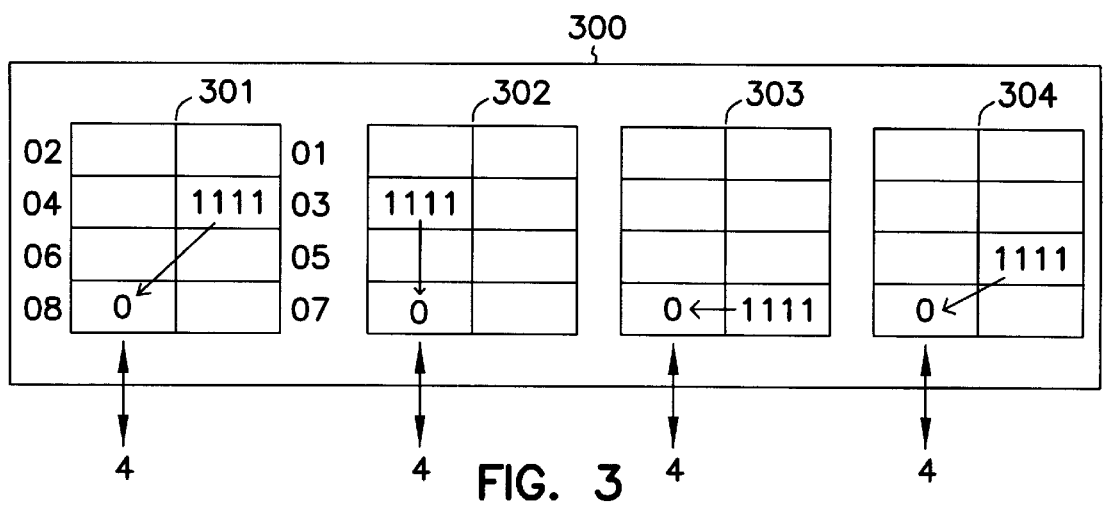
FIG. 3 is a block diagram of a memory device such as that shown in FIG. 1 which illustrates address remapping as taught by the present invention.

The application of the remapping procedure to defective locations, or cells, in memory arrays will be described first. As shown in FIG. 3, each DRAM 301–304 in a SIMM 300 is mapped to an logical address space which is divided into address sections. Each address in an address section corresponds to a memory cell in DRAM 301–304. For clarity in describing the invention, the logical address spaces of the example DRAMs 301304 have been divided into octants O1–O8 with each octant corresponding to four cells. The cells in octant O1 are mapped to the lowest addresses logical in the address space, the cells in octant O8 are mapped to the highest.

If any of the cells in octants O1–O8 are bad, the logical address space of the DRAM contains a "hole" at that address location. However, such an address hole is more easily handled if it is at either end of the logical address space rather than in the middle of the addressing range. Therefore, the invention determines which octants represents the top and the bottom of the logical address space of the DRAM, such as O1 and O8 respectively in the example. In the embodiment shown in FIG. 3 in which the bad cell is in octant O3 in DRAM 301, the invention remaps the cells in octant O3 to the addresses of octant O8. The invention also disables the addresses for O8 in DRAM 301. Now DRAM 301 has a contiguous logical address space where before the address space was disjoint because of the addressing hole caused by the defective cell in octant O3. None of the cells in O8 can be addressed, however, so the storage capacity of the DRAM has been reduced by four bits.

As will be readily apparent to one skilled in the art, the memory array 202 can be divided into address sections in multiple ways. For example, the sections can correspond to physical memory matrices making up the memory array so that the number of cells per section is dependent upon the size of each matrix. Alternatively, the sections are chosen to contain an optimal number of cells based on failure rate predictions.

When the invention is practiced in a memory module such as SIMM 300, the addresses for all the octants O8 in the SIMM are disabled when the first remapping is applied so that the logical address space for the SIMM is contiguous. As in the case of the DRAM 301, the storage capacity of the SIMM is reduced in this embodiment. However, because a defect subsequently discovered in an octant in DRAM 302–304 is also remapped into O8 by the invention, the capacity of the module is not reduced further by the later failure.

Figure 6A:
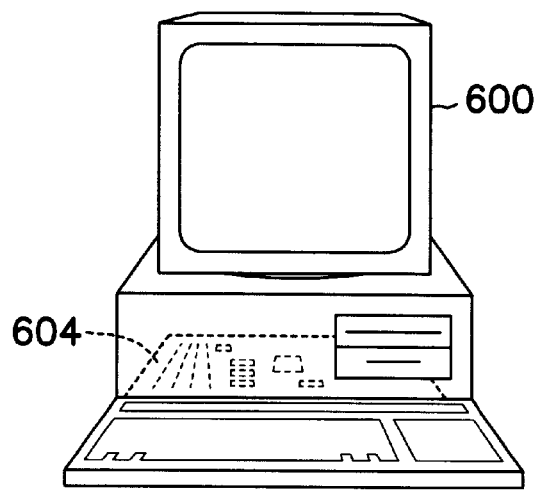
FIG. 6A is a front view of a personal computer.
Figure 6B:
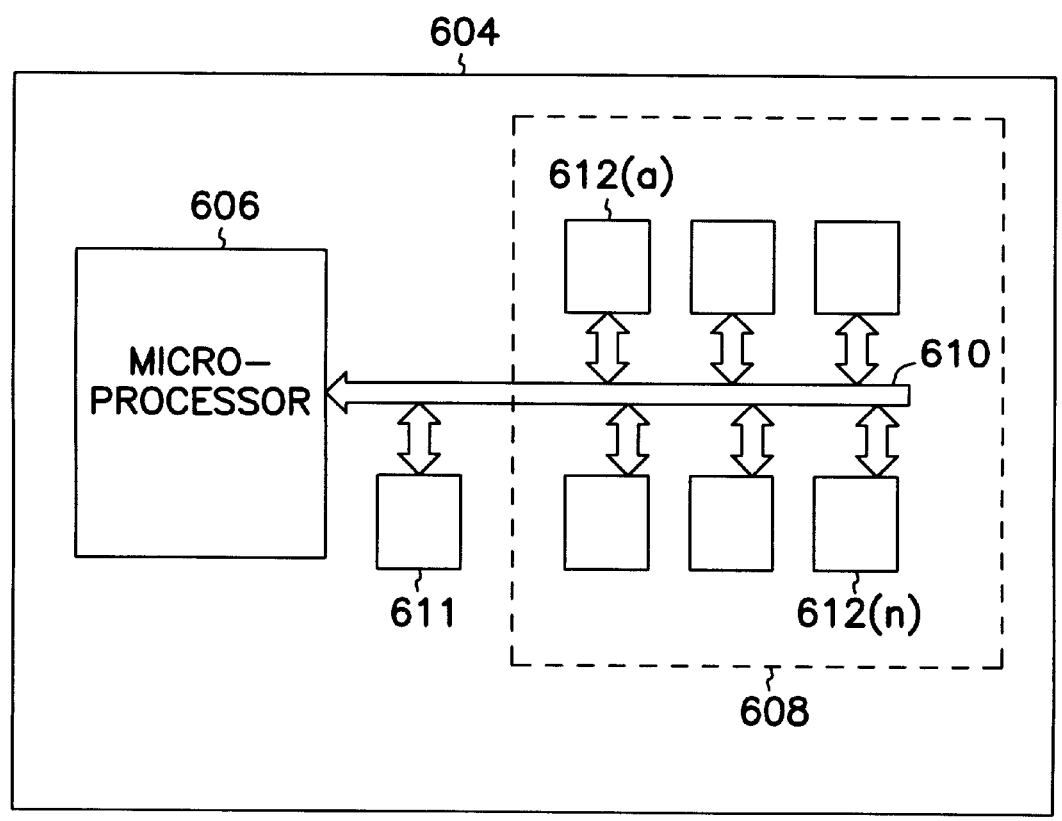
FIG. 6B is a block diagram of a system board for the personal computer shown in FIG. 6A.

The remapping procedure can be applied at various times during the life of the component which incorporates memory devices or modules. For example, the address remapping could be programmed by the manufacturer when a defect is detected in a memory device during post-fabrication testing or when a defect is detected after the memory devices are assembled into a memory module. Additionally, the programming can be embedded into memory modules installed into a computer so that defects detected in the memory during the life of the computer could be dynamically remapped. FIGS. 6A and 6B illustrate such memory modules 612 incorporated into a memory system board 604 in a personal computer 600. FIG. 6B illustrates a common configuration of a memory system board 604 in which memory modules 612(1–n) are arranged in a memory subsystem 608, coupled to a microprocessor 606 through a bus 610, and controlled by a memory controller 611. The remapping procedure can be programmed into control circuitry for a memory device, such as control circuitry 218 in FIG. 2, or into a ASIC (Application Specific Integrated Circuit) on a memory module, or embedded DRAM peripheral circuitry.

The present invention is not dependent upon any particular mechanism for disabling DRAM addresses and can be used with any of the existing well-known methods by appropriate programming. One mechanism for disabling addresses is to provide a plurality of match fuse banks which disable the addresses of the bad section of the memory. Equally applicable are lasered polysilicon fuses, or other nonvolatile storage devices or volatile storage devices, such as latches and static cells.

Among the nonvolatile storage devices are E²PROM, FLASH, polysilicon fuses, and nitride antifuses. In particular, nitride antifuses are compatible with present DRAM processing techniques and are electrically programmable, permitting flexibility in the remapping procedure. A nitride antifuse consists of a thin, nitride dielectric layer between two doped polysilicon plates. A programming voltage passed between the plates permanently breaks down the nitride layer, thus shorting the two plates together.

Figure 4:
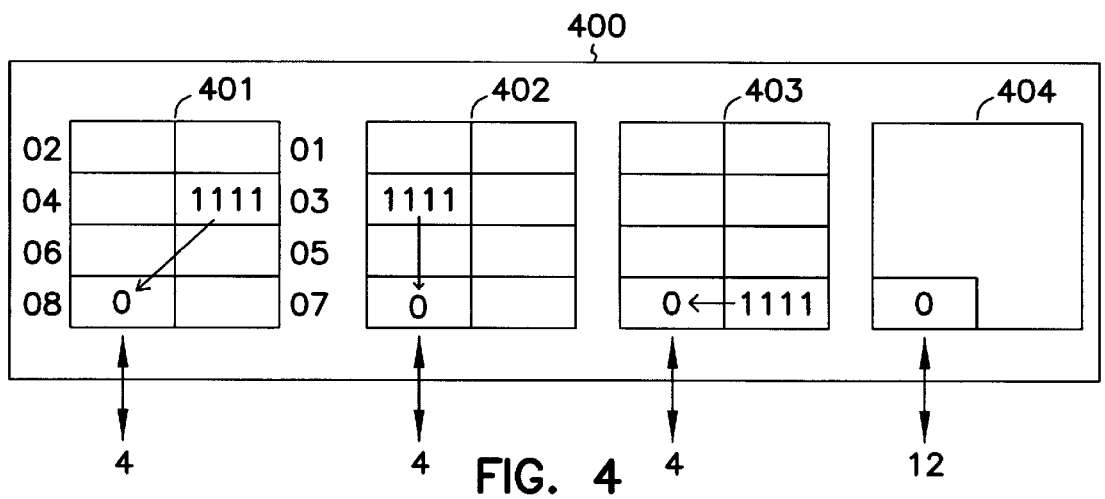
FIG. 4 is a block diagram of a memory device which utilizes partial memory devices in conjunction with the address remapping shown in FIG. 3.

A unique aspect of the present invention is shown in FIG. 4. SIMM 400 comprises DRAMs 401–403 and a spare DRAM 404, all of which are "partials" in that they contain known defects prior to being mounted onto the SIMM 400 circuit board. The remapping of the bad octants proceeds as described above in conjunction with FIG. 3 but in this embodiment, addresses of the logical address space in octants O8 of DRAMs 401–403 are directed to memory cells in spare DRAM 404. DRAM 404 only needs to have twelve good cells to replace the twelve bad cells in DRAMs 401–403; the remainder of the DRAM 404 can be defective. Thus, the present invention utilizes defective DRAMs which would otherwise be scrapped without having to meticulously match the partials. The redirection of the addresses to DRAM 404 is accomplished by enabling the row drivers of the spare memory cells through any of the mechanisms discussed above.

As shown in FIG. 4, the spare DRAM 404 is mounted in place of a DRAM on SIMM 400. However, alternate arrangements for spare DRAMs are equally applicable. For example, a spare DRAM can be mounted "piggy-back" style on top of one of the DRAMs. Alternatively, the spare DRAM can be mounted on the opposite side of the SIMM circuit board. Although these mounting arrangements increase the vertical height of the memory module, no additional surface area is required for mounting the spare memory devices on the circuit board. Referring to FIG. 6B, spare memory devices can be provided on an entirely separate circuit board 611 coupled to the memory bus 610 instead of being incorporated into the memory modules 612.

Figure 5:
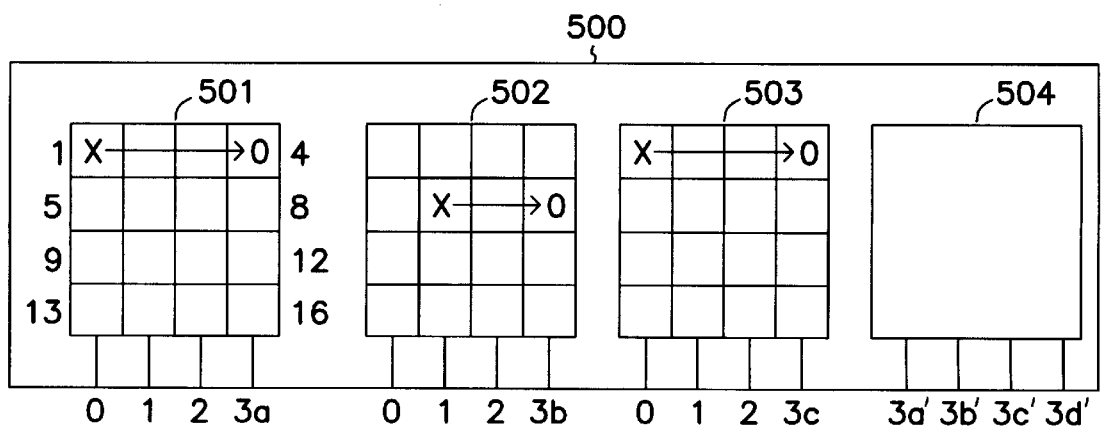
FIG. 5 is a block diagram of a memory device which illustrates input/output remapping as taught by the present invention.

The present invention also can be used to replace defective data paths in DRAMs comprising SIMM 500 as shown in FIG. 5. DQ3(a,b,c) in DRAMs 501, 502 and 503 are inert, as is DQ3(d') in spare DRAM 504. If a data path in a DRAM is defective, such as the data path between section 1 and DQ0(a) in DRAM 501, between section 1 and DQ0(b) in DRAM 503, or between section 6 and DQ1(b) in DRAM 503, the invention remaps the section with the defective data path to a section within the same DRAM that is coupled to the inert DQ3. So, as shown in FIG. 5, section 1 in DRAMs 501 and 503 is remapped to section 4 in each, and section 6 in DRAM 502 is remapped to section 8. DQ3(a',b',c') from the spare DRAM 504 are used to route data to and from the sections of memory module 500 which are coupled to the inert DQ3(a,b,c).

The remapping procedure as described herein enables the use of partials in a memory module without the need to meticulously match the partials before assembling the module. Furthermore, the remapping procedure can be invoked during fabrication of the memory device or module, or after the component is installed in a computer. Thus, the remapping procedure reduces the amount of semiconductor scrap with minimal additional manufacturing cost and provides added value to the product purchaser.

What is claimed is:

1. A method of utilizing memory having a defective memory location comprising:

mapping addresses in a logical address space to physical memory locations;

dividing the logical address space into a plurality of logical address sections;

identifying a logical address section containing the address mapped to the defective memory location; and remapping the addresses in a logical address section located at an end of the logical address space to the physical memory locations originally mapped to the addresses in the identified logical address section.

2. The method of claim 1, further comprising disabling the addresses in the end of the logical address section.

3. The method of claim 1, further comprising:

providing spare memory; and remapping the addresses in the end of the logical address section to physical locations in the spare memory.

4. The method of claim 3, wherein the spare memory contains defective memory locations.

5. A method of utilizing memory having a defective data path comprising:

mapping input/output lines to data paths;

identifying the input/output line mapped to the defective data path;

remapping a predetermined input/output line to the defective data path; and remapping a spare input/output line to replace the predetermined input/output line.

6. A memory module comprising:

a plurality of memory devices having defective physical locations and identical logical address spaces; and remapping circuitry for assigning logical addresses in a predetermined section of the identical logical address space of each memory device to the defective locations of the memory device with each of the predetermined sections lying at coinciding identical ends of each of the identical logical address spaces.

7. The memory module of claim 6, wherein the identical logical address spaces are identically divided into a plurality of sections.

8. The memory module of claim 6, wherein the logical addresses in the predetermined sections are disabled.

9. The memory module of claim 6, further comprising a spare memory device and wherein the remapping circuitry remaps the logical addresses in the predetermined sections to physical locations in the spare memory device.

10. The memory module of claim 6, wherein the memory module is a dual in-line memory module.

11. The memory module of claim 6, wherein the memory module is a single in-line memory module.

12. The memory module of claim 6, wherein the memory module is an embedded dynamic random access memory.

13. The memory module of claim 6, wherein the memory devices are dynamic random access memory devices.

14. The memory module of claim 6, wherein the memory devices are static random access memory devices.

15. The memory module of claim 6, wherein the memory devices are video random access memory devices.

16. The memory module of claim 6, wherein the memory devices are flash memory devices.

17. A method of making a memory module comprising:

selecting a plurality of memory devices having identical logical address spaces, each memory device having a defective physical location;

providing a spare memory device having a logical address space identical to the identical logical address spaces of the selected memory devices; and performing a remapping procedure to logically remap the defective memory locations into a predetermined logical address in the identical logical address space of each memory device and to logically remap locations in the spare memory device into the predetermined logical address in the identical address space of each memory device.

18. A method of making a memory module comprising:

selecting a plurality of defective memory devices, each memory device having a defective data path and a plurality of input/output lines;

providing a spare memory device having a plurality of good input/output lines equal to the plurality of defective memory devices selected for the memory module; and performing a remapping procedure to logically remap a predetermined input/output line in each memory device to the defective data path in each memory device and to logically replace the predetermined input/output line in each memory device with one of the good input/output lines in the spare memory device.

* * * * *